US006949879B1

United States Patent
Wright et al.

(12) United States Patent
(10) Patent No.: US 6,949,879 B1
(45) Date of Patent: Sep. 27, 2005

(54) OPTOELECTRONIC DISPLAY

(75) Inventors: Jeffrey Peter Wright, Edinburgh (GB); Ian Underwood, Edinburgh (GB)

(73) Assignee: Microemissive Displays Limited, Edinburgh (GB)

( * ) Notice: Subject to any disclaimer, the term of this patent is extended or adjusted under 35 U.S.C. 154(b) by 0 days.

(21) Appl. No.: 09/958,102

(22) PCT Filed: Apr. 6, 2000

(86) PCT No.: PCT/GB00/01295
§ 371 (c)(1),
(2), (4) Date: Feb. 15, 2002

(87) PCT Pub. No.: WO00/60669
PCT Pub. Date: Oct. 12, 2000

(30) Foreign Application Priority Data
Apr. 7, 1999 (GB) .............................................. 9907931

(51) Int. Cl.[7] .......................... H01L 27/15; H01L 51/20
(52) U.S. Cl. ...................................... 313/504; 313/512
(58) Field of Search ................................ 313/504–506, 313/509, 512; 315/169.3; 427/66; 345/76, 36; 257/40, 89; 428/411.1

(56) References Cited

U.S. PATENT DOCUMENTS

| 3,710,167 | A | * | 1/1973 | Dresner et al. ............. 313/504 |
| 5,256,945 | A | * | 10/1993 | Imai et al. .................. 313/504 |
| 5,294,869 | A | * | 3/1994 | Tang et al. ................. 313/504 |
| 5,525,867 | A | | 6/1996 | Williams ................. 315/169.3 |
| 5,721,299 | A | * | 2/1998 | Angelopoulos et al. ..... 524/177 |
| 5,736,754 | A | * | 4/1998 | Shi et al. ...................... 257/89 |
| 5,739,545 | A | * | 4/1998 | Guha et al. ................... 257/40 |
| 5,773,931 | A | * | 6/1998 | Shi et al. .................... 313/509 |
| 5,877,695 | A | * | 3/1999 | Kubes et al. ............. 340/815.4 |
| 5,998,805 | A | * | 12/1999 | Shi et al. ...................... 257/40 |
| 6,259,423 | B1 | * | 7/2001 | Tokito et al. ................. 345/76 |
| 6,303,943 | B1 | * | 10/2001 | Yu et al. ....................... 257/40 |
| 6,331,356 | B1 | * | 12/2001 | Angelopoulos et al. .. 428/411.1 |
| 2004/0012016 | A1 | * | 1/2004 | Underwood et al. .......... 257/40 |

FOREIGN PATENT DOCUMENTS

| EP | 0 717 445 A2 | 6/1996 |
| EP | 0 774 787 A2 | 5/1997 |
| EP | 0 845 770 A1 | 6/1998 |
| EP | 0 845 812 A2 | 6/1998 |
| EP | 0 883 190 A2 | 12/1998 |
| WO | WO 98/21755 | 5/1998 |

OTHER PUBLICATIONS

Yap, D., "See–Through, Multi–Pixel Organic Emissive Display", *Electronic Letters, GB, IEE Stevenage*, vol. 34, No. 9, pp. 915–916, Apr. 1998.

* cited by examiner

*Primary Examiner*—Vip Patel
*Assistant Examiner*—Glenn Zimmerman
(74) *Attorney, Agent, or Firm*—Howson and Howson

(57) ABSTRACT

An optoelectronic display comprises a substrate 32 of semi-conducting material and an array of organic light emitting diode (OLED) pixels arranged on the substrate, which comprises an active circuit for controlling the light emitted from each pixel. Each pixel comprises at least one layer of organic light emitting material 46, and an (at least semi-) transparent electrode 48 in contact with the organic layer on a side thereof remote from the substrate, the electrode comprising an electrically conducting polymer 50.

30 Claims, 4 Drawing Sheets

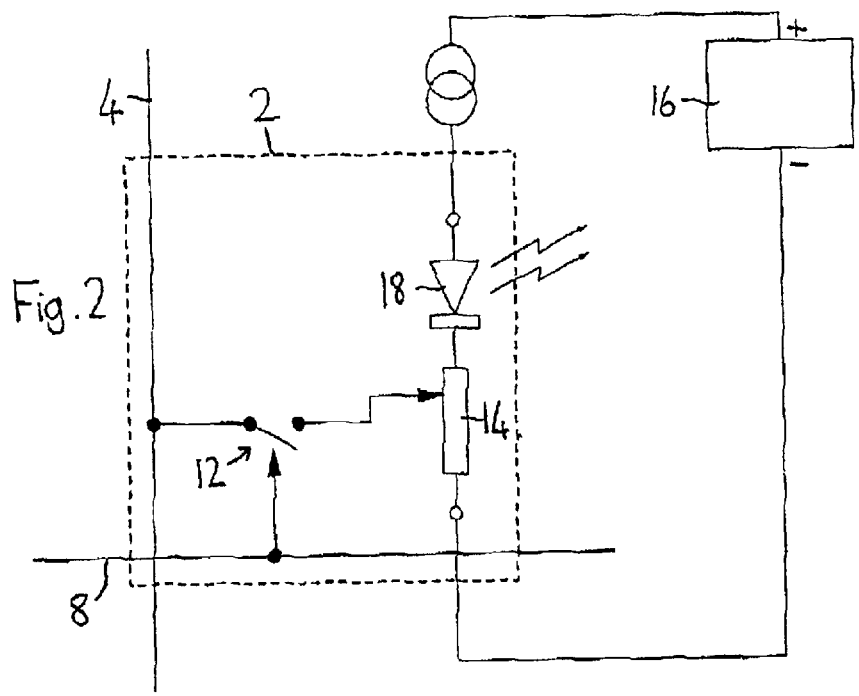
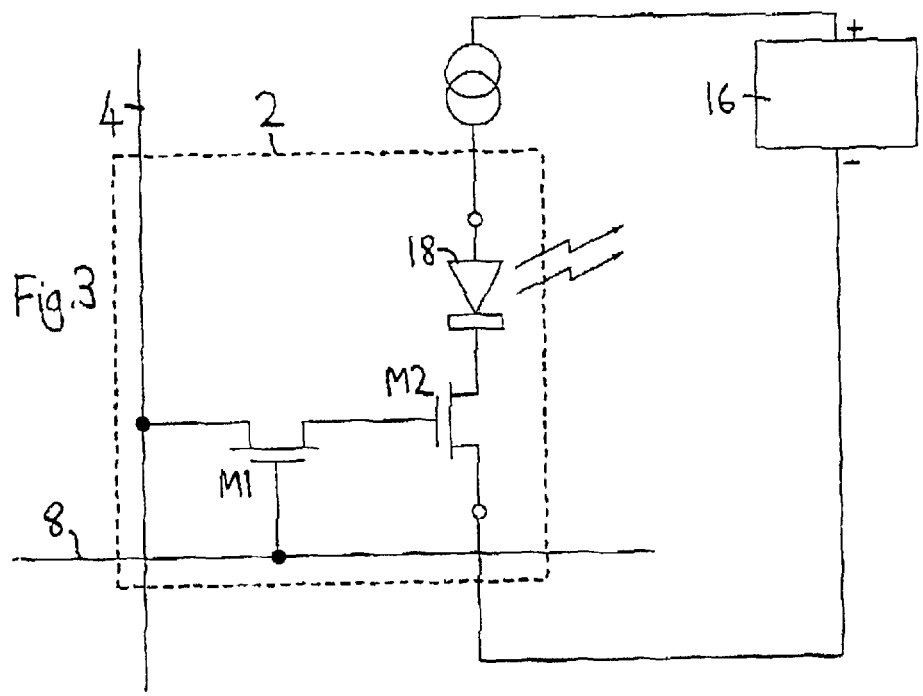

OPTOELECTRONIC DISPLAY

BACKGROUND TO THE INVENTION

The present invention relates to an optoelectronic display. Organic light emitting diodes (OLEDs) comprise certain organic materials which are known to emit light under electrical stimulation. The materials can either be small molecules or polymer materials (in polymer light emitting diodes, PLEDs). These materials require different processes for practical manufacture into display devices. Small molecule materials are deposited onto a substrate by vapour deposition whilst polymers are cast onto a substrate from a solution by spin-coating, printing, doctor blading or a reel to reel process. In a typical polymer LED, a polymer layer is deposited, by spin coating, onto indium tin oxide (ITO) coated glass. This is followed by heat treatment to drive off residual solvent and a reflective metal electrode is then evaporated onto the top surface of the polymer layer. The ITO, which is transparent, forms the other electrode and the polymer emits light through the ITO coated glass when a voltage is applied between the electrodes. Current and voltage control of the light emission is known.

Both types of materials and processes have been used to fabricate arrays on a number of different transparent and non-transparent surfaces. Methods known in the art for creating full colour displays include ink-jet printing of polymer solutions and vapour deposition of small molecule materials. Other known methods include the use of monochrome displays fitted with individual absorptive filters or colour changing media filters. Whilst both materials appear compatible with photo-resist technology, in practice the processing has reduced the efficiency and lifetime of the devices to unacceptable levels. High resolution colour and monochrome displays have been demonstrated for small molecules by depositing them into microcavities. In EP-0, 774,787, a full colour OLED array is fabricated on a CMOS substrate by this method. The drivers for the diode array are formed in the substrate. The diodes are addressed by a passive matrix of conductive strips. For high resolution displays active matrix address schemes are preferable as they are more efficient.

Several different types of flat panel displays have been fabricated with active matrix address schemes. For instance, various types of liquid crystal display have been fabricated on crystalline silicon (LCOS) and other silicon materials such as polysilicon on glass. The silicon material provides the active matrix drive circuitry as well as the substrate. Similarly, a vacuum fluorescent display has been fabricated on crystalline silicon.

The manufacture of arrays of OLEDs on non-transparent substrates such as CMOS or bi-CMOS is hindered by the need to fabricate an (at least semi-) transparent electrode on top of the organic layers to allow light emission and viewing. Deposition of indium tin oxide directly onto the organic layers can cause unacceptable deterioration in the device performance. Another consideration is the need to carefully select the choice of metal electrode material directly in contact with the substrate so that it is fully compatible with microelectronic manufacturing equipment.

SUMMARY OF THE INVENTION

According to the present invention there is provided an optoelectronic display comprising a substrate of semiconducting material and an array of organic light emitting diode (OLED) pixels arranged on the substrate, wherein the substrate comprises an active circuit for illuminating each pixel, and each pixel comprises at least one layer of organic light emitting material, and an (at least semi-) transparent electrode in contact with the organic layer on a side thereof remote from the substrate, the electrode comprising an electrically conducting polymer.

Preferably, the substrate is of crystalline silicon and the surface of the substrate may be polished or smoothed to produce a flat surface prior to the deposition of elctrode, or organic, materials of each OLED. Alternatively a non-planarised silicon substrate can be coated with a layer of conducting polymer to provide a smooth, flat surface prior to deposition of further materials.

In one embodiment, each OLED pixel comprises a metal electrode in contact with the substrate. Depending on the relative work functions of the metal and transparent electrodes, either may serve as the anode with the other constituting the cathode.

The metal electrode may consist of a plurality of metal layers, for example a higher work function metal such as aluminium deposited on the substrate and a lower work function metal such as calcium deposited on the higher work function metal. In another example, a further layer of conducting polymer lies on top of a stable metal such as aluminium. Preferably, the electrode also acts as a mirror behind each pixel and is either deposited on, or sunk into, the planarised surface of the substrate. However, there may alternatively be a light absorbing black layer adjacent to the substrate.

In still another embodiment, selective regions of a bottom conducting polymer layer are made non-conducting by exposure to a suitable aqueous solution allowing formation of arrays of conducting pixel pads which serve as the bottom contacts of the pixel electrodes.

The organic light emitting material is preferably a polymer but may alternatively be a monomer or a transition metal chelate. Apart from the light emitting material, organic layers in the pixel elements may include an electron transport material layer, a hole transport material layer, a protective cap material layer and a conducting polymer material layer.

As well as a conducting polymer, the (at least semi-) transparent electrode may comprise further layers, e.g. of indium tin oxide (ITO) or other transparent or semi-transparent metal oxides or low or high work function metals, or conducting epoxy resin, deposited onto the organic layer furthest from the substrate. Alternatively, a glass or plastic sheet, coated with ITO, conducting polymer, or at least one of the layers that constitute the (at least semi-) transparent electrode, may be bonded to said furthest layer or another layer of this electrode, to complete the electrode and serve as a barrier to the ingress of oxygen and water. The viewing surface of the display may be completed by encapsulation with a further layer of polymer or glass.

The preferred conducting polymer is poly (ethlyendioxythiophene), sold by Bayer AG under the trade mark PEDOT. Other molecularly altered poly(thiophenes) are also conducting and could be used, as could the emaraldine salt form of polyaniline. To improve the adherence of PEDOT to certain smooth substrates a polymer blend with a non-conducting polymer, preferably poly (vinyl alcohol) (PVA), can be made. For example, a 9 wt % solution of PVA with PEDOT in a 10(PVA) :6 volume ratio can be used. A wide range of molecular weights of PVA can be used without much difference in the resultant film or its conductivity.

High work function metals that could be used include tungsten, nickel, cobalt, platinum, palladium and their alloys, and possibly niobium, selenium, gold, chromium, tantalum, hafnium, technetium and their alloys.

The brightness of light emitted from each pixel is preferably controllable in an analogue manner by adjusting the voltage or current applied by the matrix circuitry or by inputting a digital signal which is converted to an analogue signal in each pixel circuit. The substrate preferably also provides data drivers, data converters and scan drivers for processing information to address the array of pixels so as to create images.

In one embodiment, each pixel is controlled by a switch comprising a voltage controlled element and a variable resistance element, both of which are conveniently formed by metal-oxide-semiconductor field effect transistors (MOSFETs). In an alternative embodiment, also preferably comprising MOSFET switches, the apparent intensity of light output from a pixel is controlled by varying the mark/space ratio of the duty cycle for which the LED is switched on, preferably by means of an analogue voltage value. This relies on the fact that for duty cycles less than about 40 ms, the eye perceives only the average brightness of the pixel during its entire duty cycle.

BRIEF DESCRIPTION OF THE DRAWINGS

In order that the present invention may be more readily understood, reference will now be made, by way of example only, to the accompanying drawings, in which:

FIG. 2 shows a generic pixel circuit;

FIG. 3 shows a specific pixel circuit implementing the generic pixel circuit of FIG. 2;

DETAILED DESCRIPTION OF THE PREFERRED EMBODIMENTS

Figure 1:
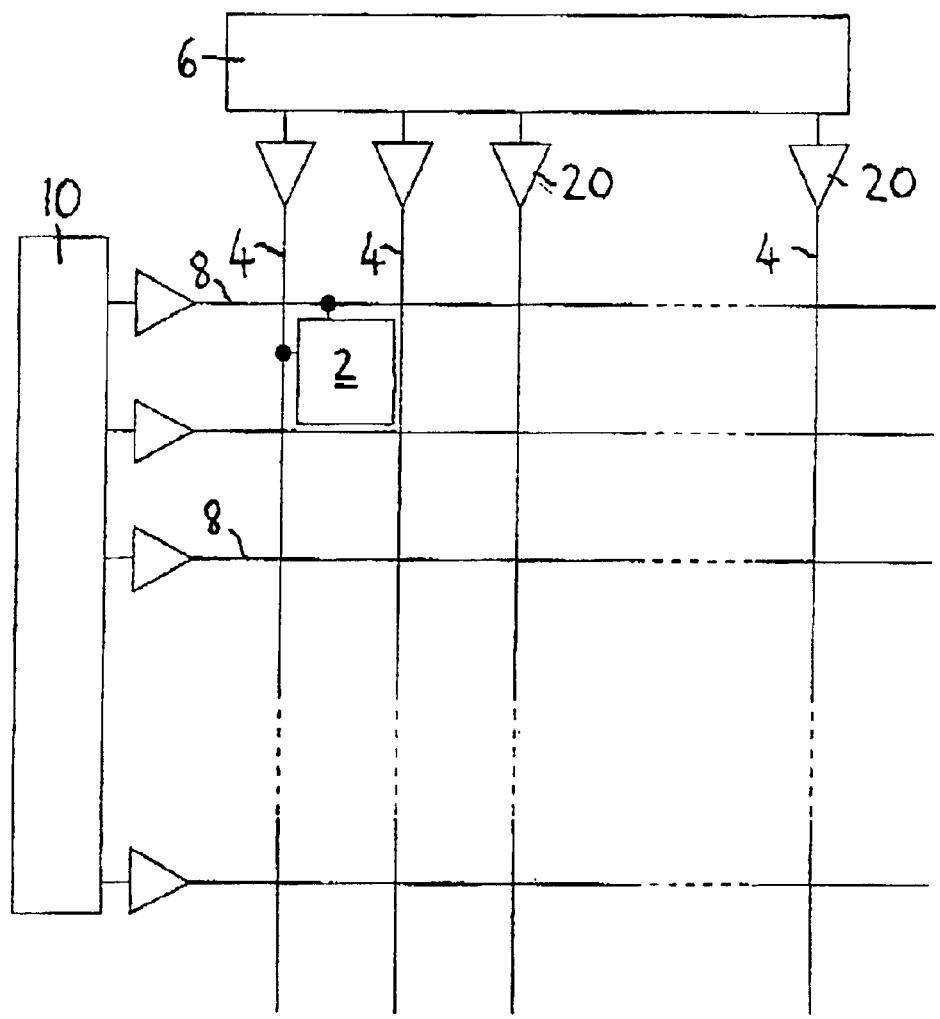
FIG. 1 is a schematic circuit diagram of an active matrix array of pixel circuits according to an embodiment of the invention.

FIG. 1 shows a rectangular array of pixel circuits 2 and circuitry for addressing them. The intensity of light to be emitted by a polymer or other organic LED is controlled by varying the current flowing through it. This is done by applying analogue signals, provided by column lines 4 and set up by a column (data arrange) circuit 6, to the pixel circuits 2 on a row-by-row basis. The required row 8 is briefly selected by a row select circuit 10 and then deselected. During the selection time slot, the data from the column lines 4 flows into the pixel of the selected row. When deselected, each pixel circuit 2 is isolated from, its column line 4 and stores the data that was input. Another set of data is assembled on the column lines 4 and another row 8 is selected. Rows may be selected sequentially or in any desired order.

FIG. 2 shows a generic form of the pixel circuit 2 indicating its operating principle. The signal on row 8 operates a voltage-controlled switch 12 to close the switch during the brief selection period and connect column bus line 4 with a node in the circuit whose signal controls an electronically programmable variable resistance 14. Thus, data flows from the column bus 4 into the pixel circuit 2, current from a global power source 16 flowing through a LED 18 at a value set by the resistance 14. The intensity of light output by the LED is controlled in turn by that current. Different light intensities can be set very effectively in the different pixels in this manner.

When the switch 12 opens, the data is maintained with the pixel circuit until different data is presented when the switch closes at the next selection of the row 8.

FIG. 3 shows how the circuit of FIG. 2 is implemented in a specific embodiment of the invention using MOS (metal-oxide-semiconductor) transistors. The voltage controlled switch is formed by a first transistor M1, the gate of which is connected to the row 8. The variable resistance is formed by the channel of a second transistor M2, which capacitatively stores charge at its gate to vary the channel resistance depending on the analogue value of the voltage generated by the stored charge. This controls the current in the LED 18 and its light output.

This is a simple but effective active pixel circuit. If it is found to suffer from pixel-to-pixel performance variations (for example due to variations in transistor threshold voltage) additional active elements can be used. Thus, for example, current mode line drivers 20 (instead of voltage mode line drivers) can be used to drive the column lines 4 shown in FIG. 1. Adding the additional elements to the column lines as shown is preferable to adding them to the pixel circuits, since if the array is square and contains $n^2$ pixel circuits, only n additional sets of elements (e.g. 128) will be required rather than $n^2$ (e.g. 16,384).

Once the active matrix circuitry has been fabricated in the semiconductor substrate, for example using CMOS technology, the surface of the substrate is planarised. This planarisation either takes place as part of the manufacturing process of the integrated circuit or as a subsequent customising step.

Figure 4:
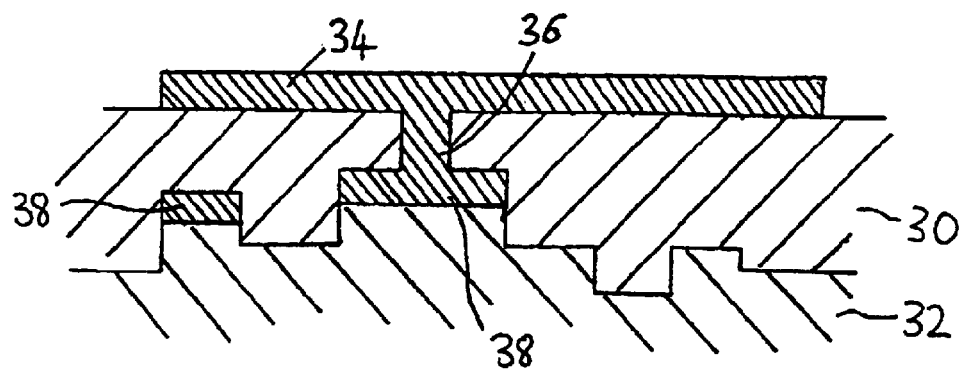
FIG. 4 is a schematic cross section of a single pixel of a planarised substrate according to an embodiment of the invention (not showing the polymer LED)

As shown in FIG. 4, the planarisation is effected by depositing a dielectric 30, for example a polymeric material, on the surface of the substrate 32. A conducting polymer that can be patterned to create areas of insulation can be used instead for this purpose. A metal mirror/electrode 34, which may be of aluminium, for connecting the LED to the appropriate point in the circuit, is then deposited, the connection to the circuit being established by a metallic conducting via 36. Metallised portions of the CMOS circuit are designated 38.

Figure 5:
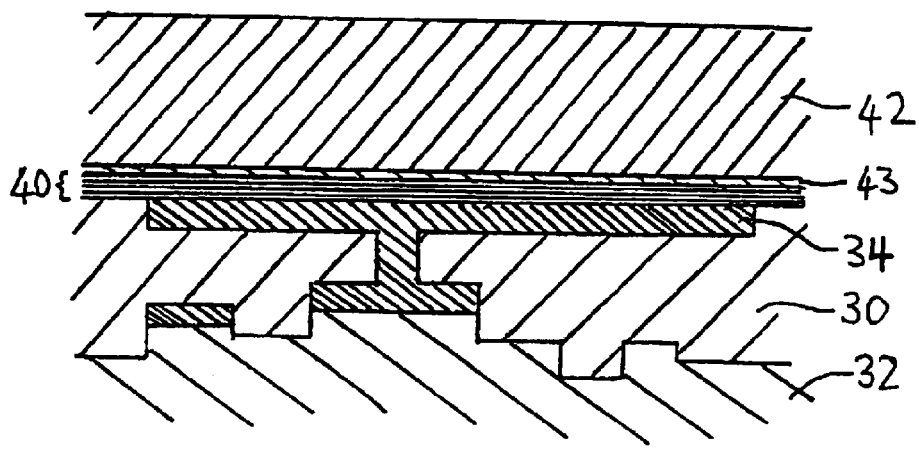
FIG. 5 is a schematic cross section of an alternative substrate, showing the deposited polymer LED.

FIG. 5 shows an alternative arrangement in which the electrode/mirror 34 is sunk into the dielectric surface, i.e. full planarisation is achieved.

FIG. 5 also shows one way in which the display construction can be completed. Appropriate layers 40 of the LED (e.g. polymer or other organic light emitting substance, conducting polymer and the like) are deposited and the display is sealed by coating with a glass plate 42 coated on its inner surface with a transparent conducting layer 43 which may in particular be of ITO, conducting polymer or both.

Figure 6:
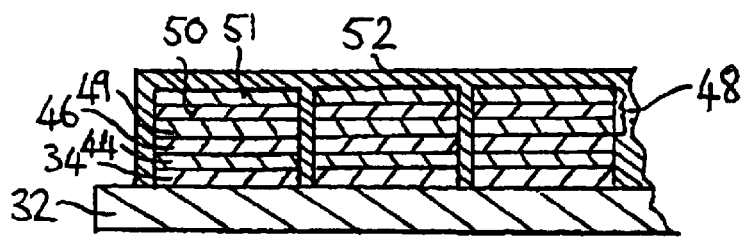
FIG. 6 is a schematic, fragmentary side view of an array of polymer LEDs.

FIG. 6 shows an alternative display construction including a particular example of the deposited layers. On the substrate 32 there are deposited, in turn, the planarised aluminium electrode/mirror 34, optionally an electron or hole transport layer 44, a light emitting polymer 46, and a transparent electrode 48. The transparent electrode may for example consist of a thin layer of high work function metal 49, of a thickness to be adequately transparent, a layer of conducting polymer 50 and a layer of ITO 51. An encapsulation layer/barrier 52 which seals all of the LEDs of the array, including their sides, completes this example of the display construction, three pixels of which are shown in FIG. 6.

In manufacturing the display shown in FIG. 6, the flat metal mirrors 34 are applied to the surface of the substrate 32 (preferably a CMOS or bi-CMOS backplane) so as to cover most of the area of each pixel with minimal gaps between the mirrors. Chemical Mechanical Polishing may be used to enhance the global and local planarisation.

The layers of polymer and related materials can be deposited by an automated technique using equipment currently used for applying photo-resists used for the patterning of integrated circuit layers. This gives precise control and a highly uniform thickness for each layer. Alternatively, the polymer layers could be ink-jet printed. Rare earth chelates can be vacuum deposited.

The encapsulation layer 52 is applied after making the connections to the transparent electrode in each pixel. Encapsulation, and also possibly the assembly of the pixel, are carried out in clean, dry conditions under a partial vacuum, or a suitable inert or controlled atmosphere.

Figure 7:
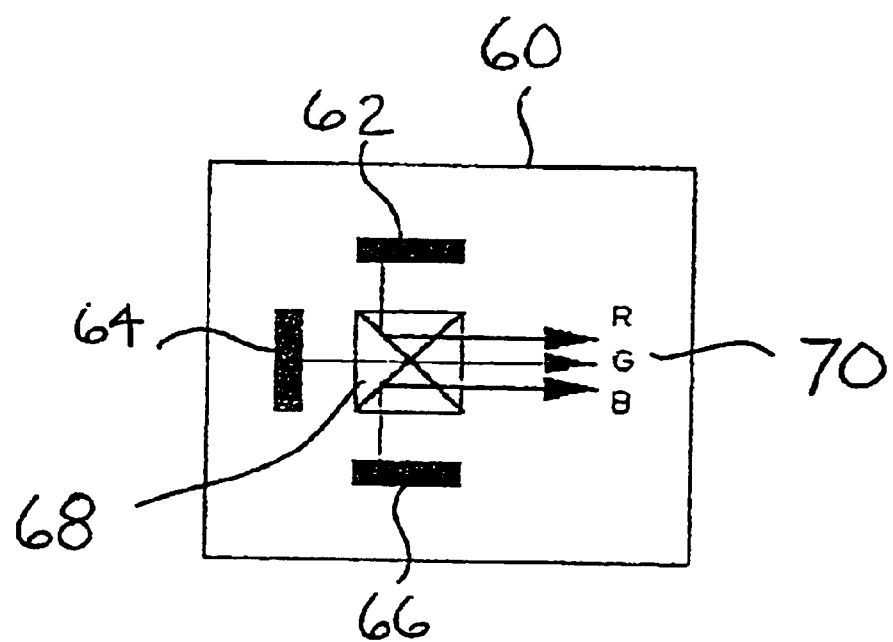
FIG. 7 is a schematic view of a color display unit according to the present invention.

The display of the invention may be monochromatic. However, monomeric and polymeric substances are now available which will emit either red, green, blue or white light and can therefore be used to form OLEDs emitting those colours. Thus, a full colour display 60 can be formed by arranging three individual backplanes, 62, 64 and 66, each emitting a different primary monochrome colour, on different sides of an optical system 68, from another side of which a combined colour image 70 can be viewed. See FIG. 7. Alternatively, polymers or other organic substances emitting different colours can be fabricated so that adjacent diode pixels in groups of three neighboring pixels produce red, green and blue light. In a further alternative, field sequential colour filters can be fitted to a white light emitting display.

Optical systems can also be used for increasing the apparent size of the displayed image, since the physical size of display is limited by the size of the silicon substrate. For example, the image can be projected on to a screen.

The display of the invention is robust, the organic LEDs being well protected, but has simplified manufacture and encapsulation. The power generated as heat should be manageable but could be decreased by reducing the current or voltage used to drive each LED. If current routing problems arise, multiple power supply bond pads can be used on the silicon chip.

What is claimed is:

1. An optoelectronic display comprising a non-planarized substrate of semiconducting material and an array of organic light emitting diode (OLED) pixels arranged on the substrate, wherein the substrate comprises an active circuit for controlling the light emitted from each pixel, and each pixel comprises at least one layer of organic light emitting material, and a light-permeable electrode in contact with the organic layer on a side thereof remote from the substrate, the electrode comprising an electrically conducting polymer provided as a coating on one of a glass sheet and a plastics sheet which is bonded to the organic layer furthest from the substrate.

2. A display according to claim 1, wherein the substrate is of crystalline silicon.

3. A display according to claim 1, further comprising a metal electrode in contact with the substrate which also serves as a mirror behind the pixel.

4. A display according to claim 1, further comprising a light absorbing black layer adjacent to the substrate.

5. A display according to claim 1, wherein the light-permeable electrode includes a layer of indium tin oxide (ITO).

6. A display according to claim 5, wherein said ITO layer is also provided as a coating on said sheet.

7. A display according to claim 1, wherein the light-permeable electrode includes a layer of low work function metal.

8. A display according to claim 1, wherein the light-permeable electrode includes a layer of high work function metal.

9. A display according to claim 1, wherein the light-permeable electrode includes a layer of conducting epoxy based resin.

10. A display according to claim 1, wherein each pixel includes a bottom electrode comprising a layer of conducting polymer.

11. A display according to claim 1, wherein each pixel includes a bottom electrode comprising a layer of metal oxide.

12. A display according to claim 1, wherein each pixel includes an organic electron transport layer in contact with the layer of light emitting material.

13. A display according to claim 1, wherein each pixel includes an organic hole transport layer in contact with the layer of light emitting material.

14. A display according to claim 1, wherein the conducting polymer is deposited from a polymer blend solution including at least one non-conducting polymer.

15. A display according to claim 1, further comprising a transparent, oxygen- and water-impermeable, encapsulating outer layer.

16. A display according to claim 1, wherein the light emitting material is monomeric.

17. A display according to claim 1, wherein the light emitting material is polymeric.

18. A display according to claim 1, wherein each OLED comprises a transition metal chelate.

19. A display according to claim 1, wherein the apparent brightness of light emitted from each pixel is controllable in an analogue manner.

20. A display according to claim 19, wherein an analogue signal varies the mark/space ratio of the duty cycle for which the OLED of each pixel is switched on.

21. A display according to claim 20, wherein each pixel circuit comprises a variable resistance element for varying the current through the OLED and hence its light intensity output.

22. A display according to claim 21, wherein said variable resistance element comprises the channel of a metal-oxide-semiconductor field effect transistor (MOSFET).

23. A display according to claim 21, wherein each pixel circuit includes a voltage-controlled switch for connecting a data signal to said variable resistance element so as to adjust its resistance.

24. A display according to claim 23, wherein said switch comprises a transistor.

25. A display according to claim 1, further comprising repeated groups of red-, blue- and green-emitting pixels for forming a color image.

26. A display according to claim 1, wherein the display is arranged to emit white light and is fitted with field sequential color filters for creating color images.

27. A color display unit comprising:
three optoelectronic displays, each optoelectronic display having a non-planarized substrate of semiconducting material and an array of organic light emitting diode (OLED) pixels arranged on the substrate, the substrate providing an active circuit for controlling the light emitted from each pixel, and each pixel having at least one layer of organic light emitting material and a light-permeable electrode in contact with the organic layer on a side thereof remote from the substrate, the electrode being an electrically conducting polymer provided as a coating on one of a glass sheet and plastic sheet which is bonded to the organic layer furthest from the substrate, and each optoelectronic display displaying an image in a different primary monochromatic color, and an optical system for combining the three images into a color image.

28. An optoelectronic display comprising a substrate of semiconducting material and an array of organic light emitting diode pixels arranged on the substrate, wherein the substrate comprises an active circuit for controlling the light emitted from each pixel, and each pixel comprises at least one layer of organic light emitting material, and a light-permeable electrode in contact with the organic layer on a side thereof remote from the substrate, the electrode comprising an electrically conducting polymer provided as a coating on one of a glass sheet and plastics sheet which is bonded to the organic layer furthest from the substrate.

29. A display according to claim 28, wherein a layer of indium tin oxide is also provided as a coating on said sheet.

30. A display according to claim 28, wherein the light-permeable electrode comprises a layer of epoxy resin.

* * * * *